June 16, 1959 E. L. GEISSINGER ET AL 2,891,202

SEMICONDUCTOR DEVICE

Filed Dec. 24, 1954

INVENTORS.
ELTON L. GEISSINGER
JOHN H. WYMAN
BY James M. Nickels
ATTORNEY

② United States Patent Office | 2,891,202
Patented June 16, 1959

1

2,891,202

SEMICONDUCTOR DEVICE

Elton L. Geissinger, Sea Girt, and John H. Wyman, Middletown, N.J., assignors to Bendix Aviation Corporation, Eatontown, N.J., a corporation of Delaware Application December 24, 1954, Serial No. 477,463

7 Claims. (Cl. 317—236)

The present invention relates to semiconductor devices and more particularly to an envelope for enclosing a semiconductor device.

In some applications it is desirable to enclose a semiconductor device in an evacuated or gas filled envelope. Heretofore, difficulty has been encountered in the sealing in that the temperatures required for sealing the envelope caused deleterious changes in the semiconductor.

The present invention provides a semiconductor device which overcomes the aforenoted difficulty in that it may be evacuated and sealed without causing deleterious changes in the semiconductor. The glass to metal seal is made before the insertion of the semiconductor and the final sealing is accomplished by a pinch weld.

It is an object of the invention to provide an improved semiconductor device.

Another object of the invention is to provide a semiconductor device of simplified construction.

Another object of the invention is to provide an improved semiconductor device that is easy and inexpensive to manufacture.

Another object of the invention is to provide a semiconductor device which is capable of being outgassed and evacuated.

Another object of the invention is to provide an improved envelope for a semiconductor device.

The above and other objects and features of the invention will appear more fully hereinafter from a consideration of the following description taken in connection with the accompanying drawing wherein two embodiments of the invention are illustrated by way of examples.

Figure 1:
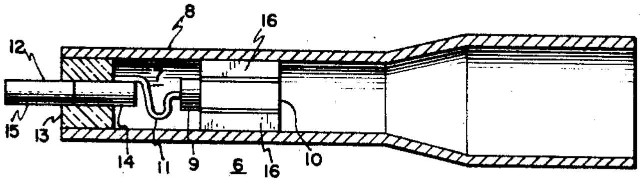
Figure 1 is a cross section of a semiconductor device, before sealing, embodying the invention.
Figure 2:
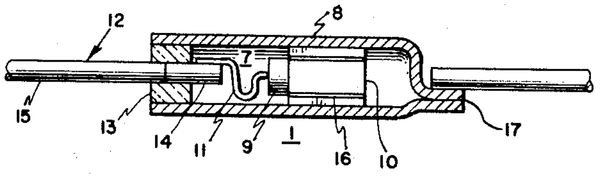
Figure 2 is a cross section of a semiconductor device embodying the invention.

Reference is now made to Figures 1 and 2, wherein similar parts have been assigned the same reference numerals, a semiconductor device is indicated generally by the numeral 6 and comprises a semiconductor unit 7 enclosed within an envelope or casing 8. The semiconductor unit 7 includes a semiconductor wafer 9, for example germanium, having one face thereof secured to a metal conducting mount 10, such for example, by brazing. An electrode or whisker 11 makes point contact with the other face of the wafer 9. The whisker 11 is secured to lead 12 which is sealed in a glass bead 13. The glass bead 13 is sealed to the envelope 8.

In assembly of the device the lead 12 is sealed in the glass bead 13. The lead 12 is of a two piece construction, one portion 14 being of a material suitable for forming a seal with glass, such for example, as an iron cobalt nickel alloy commonly known by the trade name of "Kovar." The other portion 15 being of a material suitable for an external lead, such for example, as nickel. The two portions 14 and 15 are welded together to form the unitary lead 12 with the weld being positioned within the bead 13. The whisker 11 is secured to the portion 14 of the lead 12 and formed with a U shaped loop therein or in any other suitable shape. After the lead 12, bead 13 and whisker 11 are assembled, the bead 13 is then inserted in one end of the envelope 8 with the whisker 11 extending therein. The envelope 8 is of a material suitable for forming a seal with glass, such for example, as an iron cobalt nickel alloy known under the trade name "Kovar."

The wafer 9 is secured to the mount 10 which may be of a material having relative high conductivity, such for example, as nickel. The mount 10 is provided with a plurality of longitudinal serrations or grooves 16. After assembly, the mount 10 is inserted into the envelope 8 and pressed into a position such that the whisker 11 is in contact with the wafer 9. The assembly is then evacuated and sealed off by a pinch weld 17. A lead 18 may be secured to the envelope 8 by any conventional means.

Figure 3:
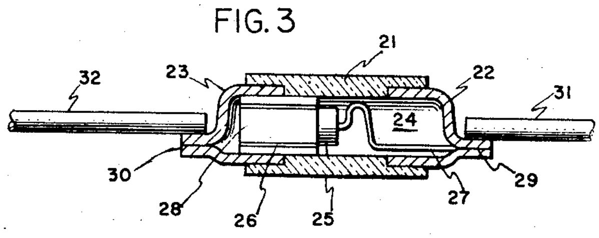
Figure 3 is a cross section of a semiconductor device illustrating another embodiment of the invention.

Reference is now made to Figure 3 wherein another embodiment of the invention is illustrated as a semiconductor device 20. The device 20 has a cylindrical body portion 21 of ceramic with metal tubulations 22 and 23 brazed to each end thereof. A semiconductor unit 24 is enclosed in the body 21. The unit 24 comprises a wafer 25 of a semiconducting material, such for example, as germanium secured to a metal body 26. An electrode or whisker 27 is secured to the wafer 25 by brazing or in any other suitable manner.

In assembly the wafer is secured to the metal body 26, which has a plurality of longitudinal grooves 28. The whisker 27 is then brazed to the wafer 25 to form the unit 24. The unit 24 is then inserted into the body 21 to which the tubulations 22 and 23 have been brazed. A pinch weld 29 is then made on the tubulation 22 anchoring the loose end of the whisker 27 thereto. The device is then evacuated through the tubulation 23 and sealed by pinch weld 30. Leads 31 and 32 may then be secured to the tubulations 22 and 23.

Figure 4:
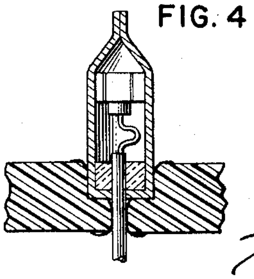
Figure 4 is a sectional view of a semiconductor device for use in a coaxial type socket.

Figure 4 illustrates how the device of Figures 1 and 2 can be adapted for use in a coaxial type socket.

Figure 5:
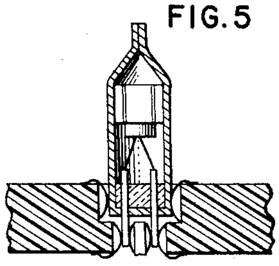
Figure 5 is a sectional view of a triode semiconductor device illustrating a further modification of the invention.

Figure 5 is a modification of Figure 2 to provide a triode device. The construction is similar to that of Figure 2 except that two electrodes or whiskers are provided instead of the one. The electrodes or whiskers are assembled in the glass bead similar to the manner in which the single whisker was assembled. The device may be constructed so as to be adapted for use in a conventional tube socket.

A device constructed in accordance with the aforenoted offers the advantage of the bulb sealing or glass work being done during the absence of the semiconductor. Also, the pinch weld final seal permits convenient evacuation and outgas without any solder flux contamination problem. The simplified construction reduces production problems and cost.

Although only two embodiments of the invention have been illustrated and described, various changes in the form and relative arrangement of the parts, which will now appear to those skilled in the art, may be made without departing from the scope of the invention.

What is claimed is:

1. An evacuated semiconductor device comprising a semiconductor element, a point contact element, a metallic body element, a glass bead having a conductor extending through and sealed therewith, said conductor being connected to and supporting said point contact element, a glass to metal seal between said bead and said body element, a supporting member for said semiconductor element fitted into said body, and a pinch weld sealing said body.

2. An evacuated semiconductor device comprising a semiconductor element including a crystal of semiconductor material and associated electrodes, an envelope for enclosing said semiconductor element and at least one pinch weld for sealing said envelope, one of said electrodes being electrically connected to a respective pinch weld, and the other of said electrodes having an electrical connection extending from said envelope.

3. An evacuated semiconductor device comprising, a metallic casing, a vitreous bead having a lead extending therethrough and forming a seal for one end of said casing, an electrode supported by said bead inside of said casing, a wafer of semiconductor material, means for supporting said wafer inside of said casing and in contact with said electrode, and a pinch weld sealing the other end of said casing.

4. An evacuated semiconductor device comprising a metallic casing, a glass bead having a glass to metal seal with one end of said casing, a two piece lead extending through said bead, one section of said lead extending into said casing and being of a material to form a glass to metal seal with said bead, the other section extending outward from said bead and being of a material having greater flexibility than said first section, an electrode supported by said first section, a germanium crystal, means for supporting said crystal in said casing in contact with said electrode, and a pinch weld sealing the other end of said casing.

5. An evacuated semiconductor device comprising a tubular casing, metallic tubulations secured to each end of said casing, a semiconductor wafer supported in one of said tubulations, an electrode supported in the other of said tubulations, said electrode extending in said casing in contact with said wafer, and pinch welds sealing said tubulations.

6. A method of making an evacuated semiconductor device comprising assemblying a lead through a glass bead and mounting an electrode on said lead, sealing said glass bead to a casing with the electrode extending inward, mounting a semiconductor wafer on a supporting member, inserting the supporting member into the casing so that the electrode is in contact with the wafer, evacuating the unit and sealing off with a pinch weld.

7. A method of producing an evacuated semiconductor device comprising assembly of a whisker mounting, sealing said whisker mounting in one end of a casing, assembly of a semiconductor wafer on a mounting slug, pressing said slug into said casing until the wafer comes into contact with said whisker, evacuating said unit and pinching off the other end of said casing to provide a hermetically sealed device.

References Cited in the file of this patent

UNITED STATES PATENTS

| | | |
|---|---|---|
| 2,588,956 | Brittain et al. | Mar. 11, 1952 |
| 2,664,528 | Stelmak | Dec. 29, 1953 |
| 2,682,022 | Doran | June 22, 1954 |